United States Patent
Ichihara

(10) Patent No.: US 7,257,178 B2
(45) Date of Patent: Aug. 14, 2007

(54) BASE BAND CIRCUIT OF RECEIVER AND LOW CUT-OFF FREQUENCY CONTROL METHOD

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 988 days.

(21) Appl. No.: 10/341,420

(22) Filed: Jan. 14, 2003

(65) Prior Publication Data

US 2003/0142767 A1    Jul. 31, 2003

(30) Foreign Application Priority Data

Jan. 30, 2002    (JP)    ............................. 2002-020842

(51) Int. Cl.
*H04L 27/08* (2006.01)

(52) U.S. Cl. ...................... 375/345; 375/317; 375/319; 455/226.2; 455/234.1; 455/250.1; 455/251.1; 330/254; 330/278

(58) Field of Classification Search ................ 375/286, 375/287, 292, 317, 319, 345; 330/254, 278; 455/226.1, 226.2, 232.1, 234.1, 234.2, 250.1, 455/251.1, 307

See application file for complete search history.

(56) References Cited

U.S. PATENT DOCUMENTS

| 5,757,247 A | * | 5/1998 | Koukkari et al. ........... 333/17.1 |
| 6,449,471 B1 | * | 9/2002 | Katsura et al. ............. 455/324 |
| 7,003,271 B2 | * | 2/2006 | Kluge et al. ............. 455/240.1 |
| 7,062,244 B2 | * | 6/2006 | Gharpurey et al. ...... 455/242.1 |

FOREIGN PATENT DOCUMENTS

JP      H08-307465 A    11/1996
WO     WO 01/47105 A2   6/2001

\* cited by examiner

*Primary Examiner*—Dac V. Ha
(74) *Attorney, Agent, or Firm*—Sughrue Mion, PLLC

(57) ABSTRACT

A base band circuit of a receiver and a low cut-off frequency control means can quickly converge transition state due to gain fluctuation with setting a low cut-off frequency of a high-pass filter as low as possible. The base band circuit of a receiver has a variable amplifier variably amplifying a base band signal depending upon a gain control signal, a high-pass filter provided in a path of the base band signal, and a controller detecting variation magnitude of the gain control signal and controlling variation of a low cut-off frequency of the high-pass filter means depending upon the detected variation magnitude.

12 Claims, 9 Drawing Sheets

$$\left\{ \begin{array}{l} \text{SWITCH OFF:} \quad \alpha = \dfrac{1}{C\,(R_1+R_2)} \\ \text{SWITCH OFF:} \quad \alpha = \dfrac{1}{C\,R_2} \end{array} \right.$$

… … …
BASE BAND CIRCUIT OF RECEIVER AND LOW CUT-OFF FREQUENCY CONTROL METHOD

BACKGROUND OF THE INVENTION

1. Field of the Invention

The present invention relates generally to a base band circuit of a receiver and a low cut-off frequency control method. More particularly, the invention relates to a direct conversion type receiver having a high-pass filter for blocking transmission of a direct current offset in the base band circuit.

2. Description of the Related Art

A direct conversion type receiver is expected to widely spread toward the future for capability of simplification of a high frequency circuit portion to permit decreasing of number of parts, such as filter and so forth, and capability of execution of most functions, such as band restriction, AGC (automatic gain control) and so forth, within a base band range so that most of the functions can be realized by CMOS analog circuits for facilitating packaging into LSI, as compared with the conventional super-heterodyne type receiver.

FIG. 7 is a block diagram showing a particular construction of the direct conversion type receiver of this kind. In FIG. 7, a high frequency signal received by an antenna 401 is subject to band restriction by a high frequency band-pass filter 402 for extracting a signal of reception band. A band restricted signal is amplified by a low noise amplifier (LNA) 403, and then input to an orthogonal demodulator 404 as it is. The orthogonal demodulator 404 is driven by a local signal generated by a local oscillator 425. The local signal is the same as a center frequency of the high frequency signal to be received. By the orthogonal demodulator 404, the base band signal is directly generated from the high frequency signal. In FIG. 7, the reference numeral 431 denotes a balanced amplifier, 432 and 433 are frequency mixers and 434 is a phase shifter.

The base band signal is two series signals of I and Q. After band restriction of the base band signal by base band filters 405 and 406, the base band signal is amplified by an AGC circuit 407 so that an average amplitude becomes constant. A circuit controlling a gain and algorithm therefor are not directly related to the present invention and detailed discussion for this circuit will be eliminated. A dynamic range of the AGC circuit 407 reaches several tens dB (in case of CDMA (Code Division Multiple Access) system, the dynamic range is about 80 dB). Outputs of the AGC circuit 407 are output to later stages as respective signals 423 and 424. It should be noted that the reference numerals 408 to 411 and 412 to 415 are voltage controlled variable gain amplifiers which are controlled by a control circuit 416. The reference 422 is an external gain control signal.

In the direct conversion system, a channel filter for restricting an adjacent channel is not a SAW filter of an IF band but are realized by base band filters 405 and 406. Since these are realized by a circuit employing an active element, it is adapted for packaging into IC. On the other hand, since the high frequency is directly converted into the base band, a second local oscillator becomes unnecessary. Therefore, all reception circuit from the LNA 403 to a base band output can be integrated as a single chip IC package. This contributes to down-sizing of a cellular telephone and to reducing number of parts.

However, in the filters 405 and 406 and the AGC circuit 407, under presence of a direct current offset even a little, a gain of AGC reaches as large as 80 dB in some case to cause saturation where the output is retained at a power source level or ground level. For example, assuming that a direct current offset of 1 mV is present at the filter 405 and a gain of the AGC circuit 407 is 80 dB, namely ten-thousand times, 10V of direct current component appears on the output of the AGC circuit 407. Of course, in case of the cellular phone or the like, such voltage is far beyond a voltage of a battery, the cellular phone or the like causes failure in operation. Accordingly, in the base band circuit of the direct conversion type receiver, it is the most important task to remove the current offset as much as possible.

The simplest method for removing the direct current offset is C-cut (blocking of direct current by capacitors) as shown in FIG. 8. In the circuit of FIG. 8, high-pass filters 305 to 307 corresponding to C-cut are inserted between VGAs (Variable Gain Amplifiers) forming the AGC circuit or between outputs of VGAs. In FIG. 8, a filter 301 is a low-pass filter performing band restriction of the base band and a transfer function of the filter 301 is assumed as H(s). Since the low-pass filter per se is not directly related to the present invention, detailed discussion thereof is eliminated from the disclosure. In practice, the constructions shown in FIG. 8 are present in both of two series I and Q. Since both are identical circuits, discussion will be given hereinafter for only one series. By the circuit of the shown construction, transfer of the direct current offsets generated at various portions to be output side are prevented. Here, a transfer function of the band bass filter is assumed as B(s).

However, in the C-cut, it is required to insert a plurality of high-pass filters for certainly removing direct current offset component generated in respective portions, as shown in FIG. 8. In order to transfer the signal to later stage with high fidelity, it is desirable to set a cut-off frequency of the high-pass filter as low as possible. With the shown construction, static direct current offset can be prevented substantially completely.

However, the following problems are encountered in practice. For example, assuming that an input converted offset of the variable gain amplifier (hereinafter referred to as VGA) 304 (direct current offset as converted at point "a") is Vofs, and further assuming that a value of Vofs is not variable in time, a direct current voltage is constant as shown by "a" in FIG. 9. Here, it is assumed that the gain of the VGA 304 is initially one time (0 dB), is varied to be ten times (20 dB) at a time "t0". A waveform "b" in FIG. 9 shows a voltage at an output point "b" of the VGA. As shown by the waveform "b", the voltage at the point "b" should be suddenly varied from Vofs to 10×Vfos at the time t0.

A high-pass filter output (voltage at point "c") produced by C-cutting the waveform by a high-pass filter 307 becomes a waveform shown by a solid line "c" of FIG. 9. As can be clear from this waveform, a static direct current offset voltage can be removed by C-cut. By fluctuation of the input converted offset and gain of the VGA, transitional waveform appears at the output. This waveform also becomes interference in processing of the base band signal in the demodulation circuit in the later stage (which demodulation circuit is not explicitly disclosed in the present invention).

A peak value $V_{peak}$ in transition can be expressed by the input converted offset Vofs of the VGA and gains g0 and g1 before and after the VGA as follow:

$$V_{peak} = (g1-g0) \times \text{Vofs} \qquad (1)$$

Namely, the peak value is greater at greater fluctuation of gain.

On the other hand, concerning a continuation period of the waveform "c", it is assumed that a convergence period of the voltage to 1% of the peak value $V_{peak}$ is τ, the high-pass filter 307 is a linear filter and a cut-off frequency is fc, the convergence period τ can be expressed by $$\tau = -ln(0.01)/2\,\pi fc \qquad (2)$$

For example, fc is 10 kHz, τ becomes about 73.3 μsec. This value corresponds to about 281 chips (assuming a chip rate is 3.84 Mcps) in W-CDMA. This period is considerably long. When variation of gain is significant, such long period of τ causes deterioration of a bit rate. In contrast to this, if fc is 1 MHz, τ becomes 0.733 μsec. Thus, convergence period of transition to less than or equal to about 1% of the peak value can be restricted within two to three chips.

However, in the normal state where variation of the gain is small, there is a demand to set the cut-off frequency as low as possible. Namely, control is required in such a manner that (1) when variation of the gain is sufficiently small (e.g. ≦6 dB), the low cut-off frequency is set as low as possible (e.g. about 10 kHz).

(2) when variation of gain exceeds a predetermined value (e.g. >6 dB, the low cut-off frequency is set higher (e.g. about 1 MHz) for quickly converging the direct current offset in transition (e.g. as waveform shown by broken line d of FIG. 9).

On the other hand, while discussion has been given for a measure in transition due to gain fluctuation of the VGA 304, transition is equally caused in VGA 302 and VGA 303 if fluctuation of the gain is caused and is output via the high-pass filters 305 to 307. Accordingly, similar problem can be encountered to require similar measure.

SUMMARY OF THE INVENTION

The present invention has been worked out in view of the problem set forth above. It is therefore an object of the present invention to provide a base band circuit of a receiver and a low cut-off frequency control method which can quickly converge transition state due to gain fluctuation with setting a low cut-off frequency of a high-pass filter as low as possible.

According to the first aspect of the present invention, a base band circuit of a receiver comprises:

variable amplifier means for variably amplifying a base band signal depending upon a gain control signal;

high-pass filter means provided in a path of the base band signal; and control means for detecting variation magnitude of the gain control signal and controlling variation of a low cut-off frequency of the high-pass filter means depending upon the detected variation magnitude.

The high-pass filter means may have two low cut-off frequencies and the control means selectively varies the low cut-off frequency depending upon the variation magnitude. The gain control signal may be an analog signal, the control means includes means for generating an absolute value of a signal corresponding to the variation magnitude by differentiating the analog signal in time and means for comparing the absolute value and a predetermined value for varying the low cut-off frequency depending upon a result of comparison.

Also, the control means controls in such a manner that the low cut-off frequency is set at a lower value when the variation magnitude is smaller than a predetermined value and the low cut-off frequency is set at a higher value higher than the lower value when the variation magnitude is greater than or equal to the predetermined value. On the other hand, the control means operates provide a predetermined delay period in control timing upon varying the low cut-off frequency from the higher value to the lower value.

In the alternative, the gain control signal is a digital signal, the control means includes means for sampling the digital signal at a predetermined interval and means for comparing an absolute value of variation magnitude of the digital signal within the sampling interval and a predetermined value for varying the low cut-off frequency depending upon a result of comparison.

According to the second aspect of the present invention, a low cut-off frequency control method in a base band circuit of a receiver including variable amplifier means for variably amplifying a base band signal depending upon a gain control signal and high-pass filter means provided in a path of the base band signal, comprises:

control step of detecting variation magnitude of the gain control signal and controlling variation of a low cut-off frequency of the high-pass filter means depending upon the detected variation magnitude.

In the operation of the present invention, in the base band circuit of the receiver designed for variably amplifying the base band signal depending upon the gain control signal, when variation of the gain is sufficiently small (e.g. ≦6 dB), a low cut-off frequency in a high-pass filter for blocking direct current is set as low as possible, and when variation of gain exceeds a predetermined value (e.g. >6 dB), the low cut-off frequency is set higher(e.g. about 1 MHz) for quickly converging the direct current offset.

By performing such control set forth above, the low cut-off frequency can be lowered when fluctuation of gain is small to feed the waveform to the demodulation circuit with high fidelity as high as possible to obtain stable receiving performance. On the other hand, when fluctuation of gain is large, large transitional direct current offset is caused. Therefore, in such case, the low cut-off frequency is set higher to quickly converge the direct current offset in transition.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings.

DESCRIPTION OF THE PREFERRED EMBODIMENT

The present invention will be discussed hereinafter in detail in terms of the preferred embodiment of a base band circuit of a receiver, particularly a direct conversion type receiver, and a low cut-off frequency control means according to the present invention with reference to the accompanying drawings. In the following description, numerous specific details are set forth in order to provide a thorough understanding of the present invention. It will be obvious, however, to those skilled in the art that the present invention may be practiced without these specific details.

Figure 1:
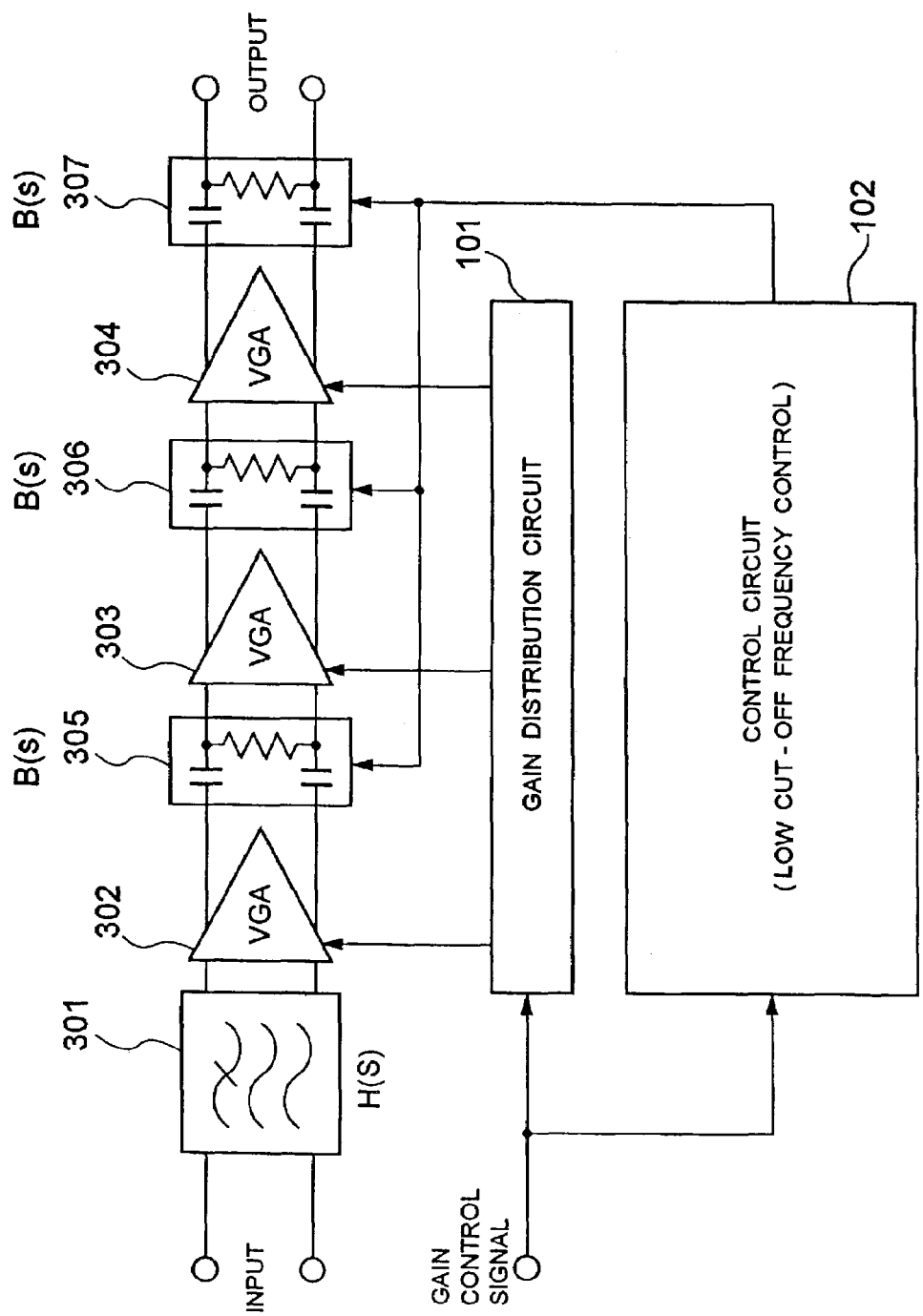
FIG. 1 is a conceptual illustration for explaining a low-frequency cut-off control method of a base band circuit of a direct conversion type receiver according to the present invention.

FIG. 1 is a conceptual illustration for explaining a low-frequency cut-off control method of a base band circuit of a direct conversion type receiver according to the present invention. In the following disclosure, like components to those in FIG. 8 will be identified by like reference numerals and disclosure for these common components will be eliminated for avoiding redundant disclosure and whereby to keep disclosure simple enough to facilitate clear understanding of the present invention. It should be noted that a path through which abase band signal passes, is identical to that of FIG. 8. What is newly added in the preferred embodiment of the present invention, is an input terminal of a gain control signal, a gain distribution circuit 101 generating gain control signals to be supplied to respective VGA (variable Gain Amplifier) by branching the gain control signal, and a control circuit 102 taking the gain control signals as inputs, monitoring variation of the gain control signals and performing control for varying low cut-off frequency of respective high-pass filters 305, 306 and 307 depending variation of the gain control signals.

Among these newly added components, the gain distribution circuit is not directly related to the present invention. Therefore, detailed description of the gain distribution circuit is eliminated. Briefly discussing, it is only required to vary a gain of entire base band circuit depending upon input gain control signal. Therefore, the gain distribution circuit has a function for distributing the gain of the entire base band circuit to a plurality of VGAs.

What is important for the present invention is constructions and operations of the high-pass filters 305, 306 and 307 and the control circuit 102. As set forth in terms of the prior art, the object of the present invention is to realize control in such a manner that (1) when variation of the gain is sufficiently small (e.g. ≦6 dB), the low cut-off frequency is set as low as possible (e.g. about 10 kHz).

(2) when variation of gain exceeds a predetermined value (e.g. >6 dB), the low cut-off frequency is set higher (e.g. about 1 MHz) for quickly converging the direct current offset in transition. By performing control as set forth above, the low cut-off frequency can be lowered when fluctuation of gain is small to feed the waveform to the demodulation circuit with high fidelity as much as possible to obtain stable receiving performance. On the other hand, when fluctuation of gain is large, large transitional direct current offset is caused. Therefore, in such case, the low cut-off frequency is set higher to quickly converge the direct current offset in transition to be less than or equal to 1% of the peak value to restore stable receiving condition.

Figure 2:
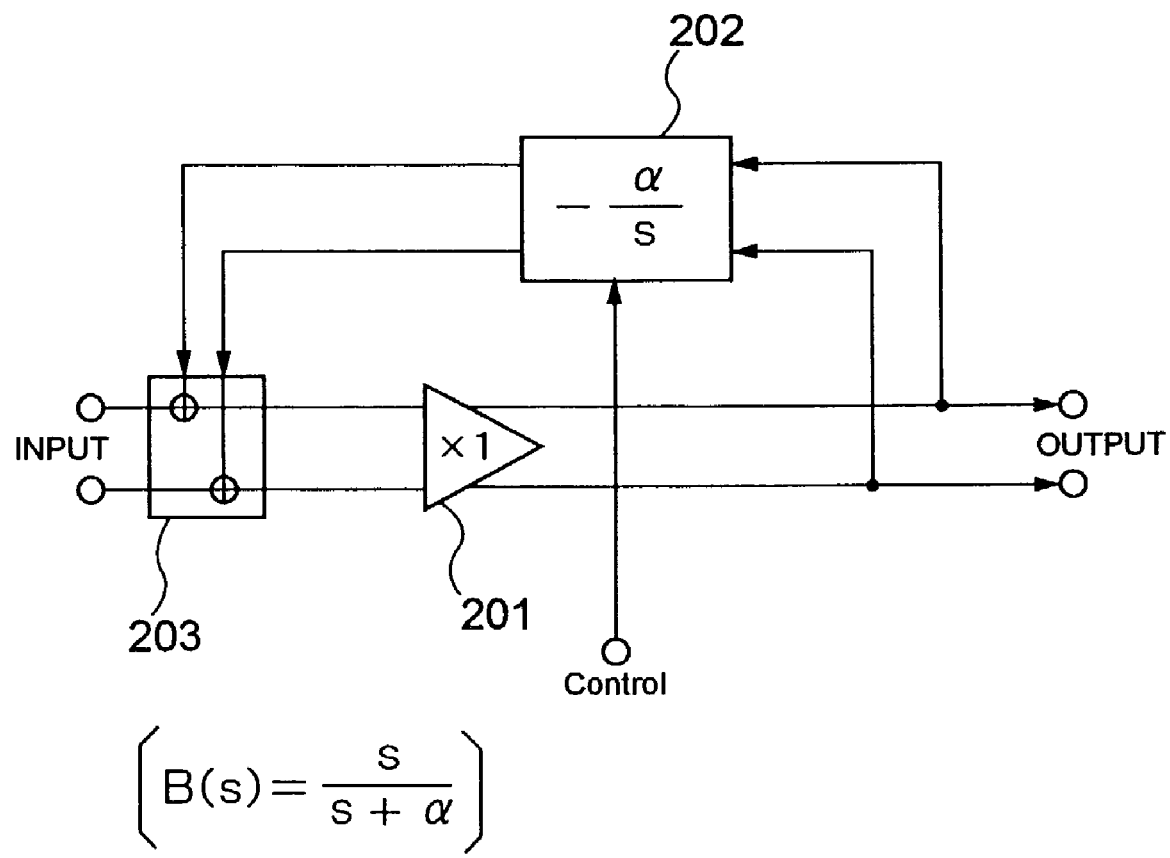
FIG. 2 is a block diagram showing a construction of a high-pass filter variable of low cut-off frequency, to be used in the preferred embodiment of the present invention.
Figure 8:
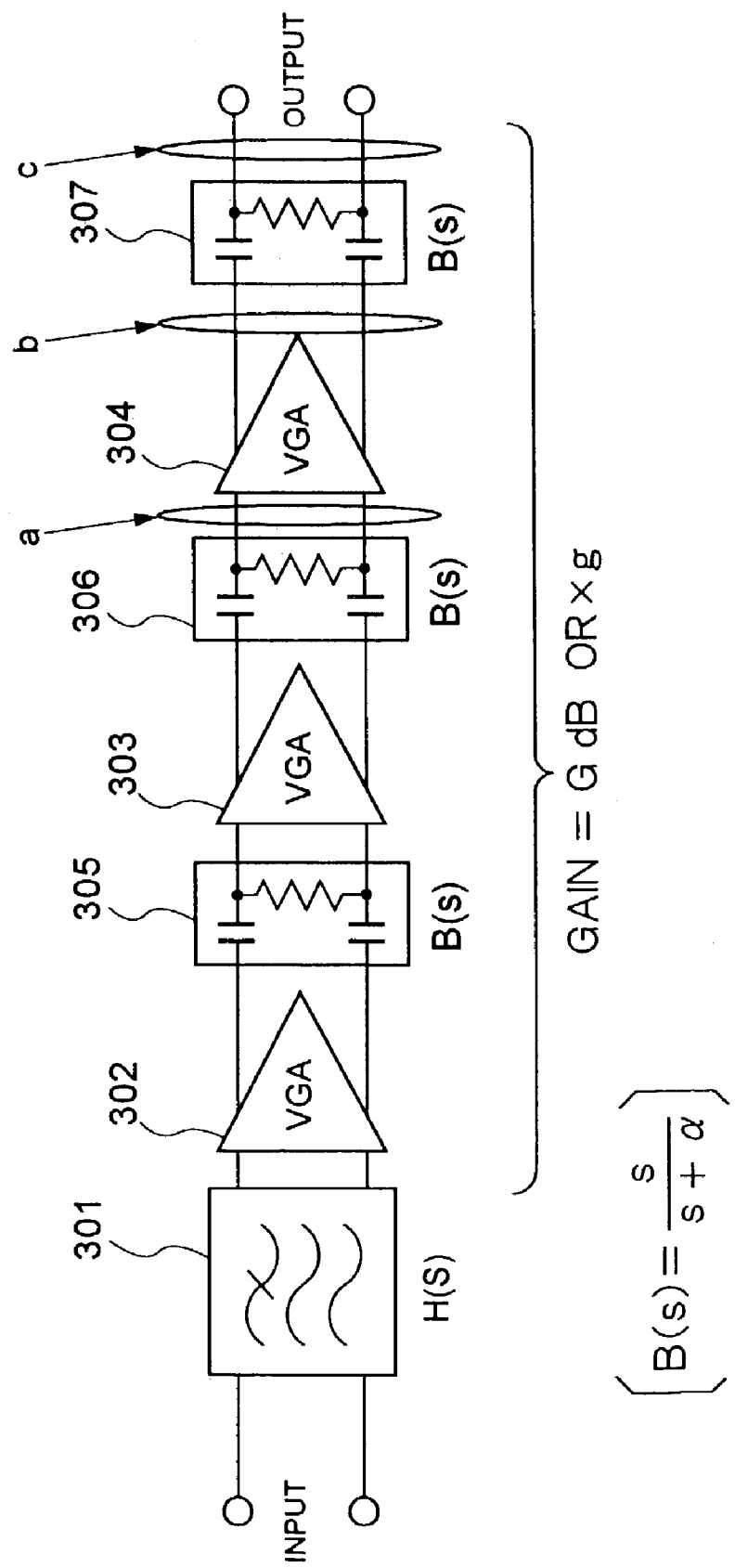
FIG. 8 is an illustration showing a construction of the conventional base band circuit of the direct conversion type receiver.
Figure 9:
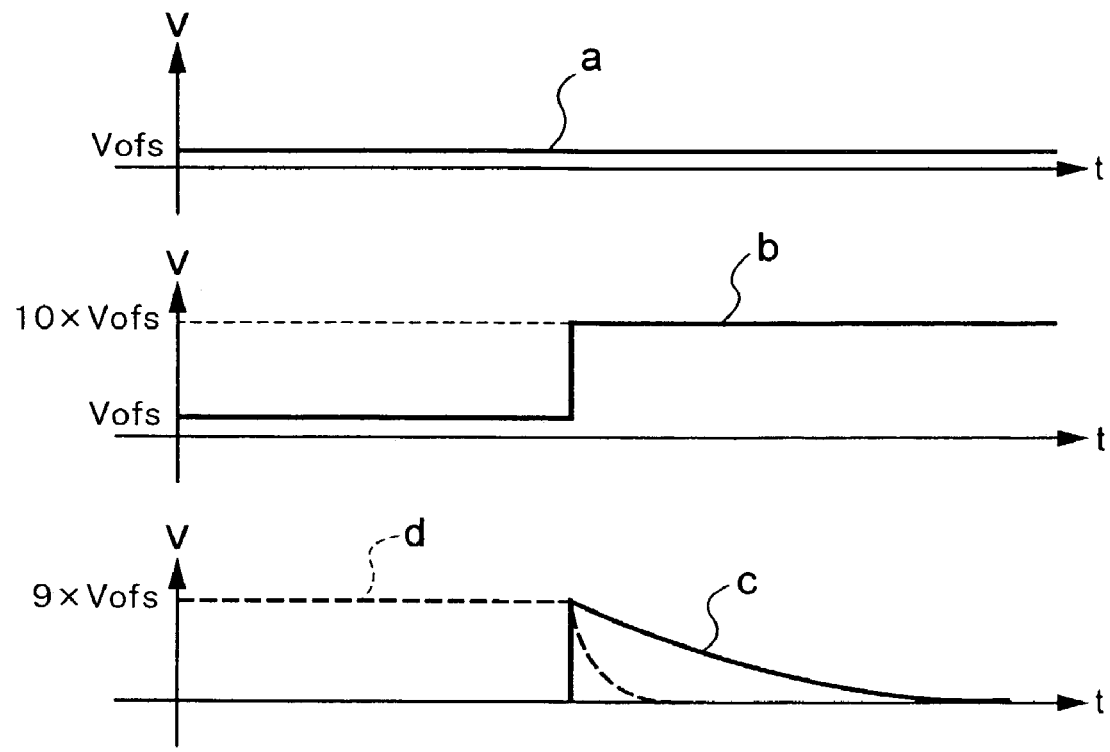
FIG. 9 is a timing chart for explaining transition state caused in the base band circuit upon occurrence of variation of gain.

In order to realize such function, the high-pass filters 305, 306 and 307 are required to have a construction capable of adjusting the low cut-off frequency. In FIG. 8, the high-pass filter is premised to have simple linear construction with the capacitor and resistor. In contrast to this, in the present invention, consideration is given to a construction that an output of a buffer amplifier (having one time gain) 201 is integrated by an inverting integrator 202 and fed back to an adder 203, as shown in FIG. 2. In FIG. 2, α is an integration constant. The transfer function of this construction can be expressed by the following expression.

$$B(s)=s/(s+\alpha) \quad (3)$$

Then, the cut-off frequency fc is expressed by using α as follow:

$$fc=\alpha/2\pi \quad (4)$$

This is the same type as the simple high-pass filter formed by the capacitor and the resistor. Advantages of the construction set forth above is capability of containing functions of an amplifier having gain or low-pass filter to drastically cancel the direct current offset. This point is not directly relevant to the present invention and thus is eliminated the detailed description thereof in the following disclosure.

Figure 3:
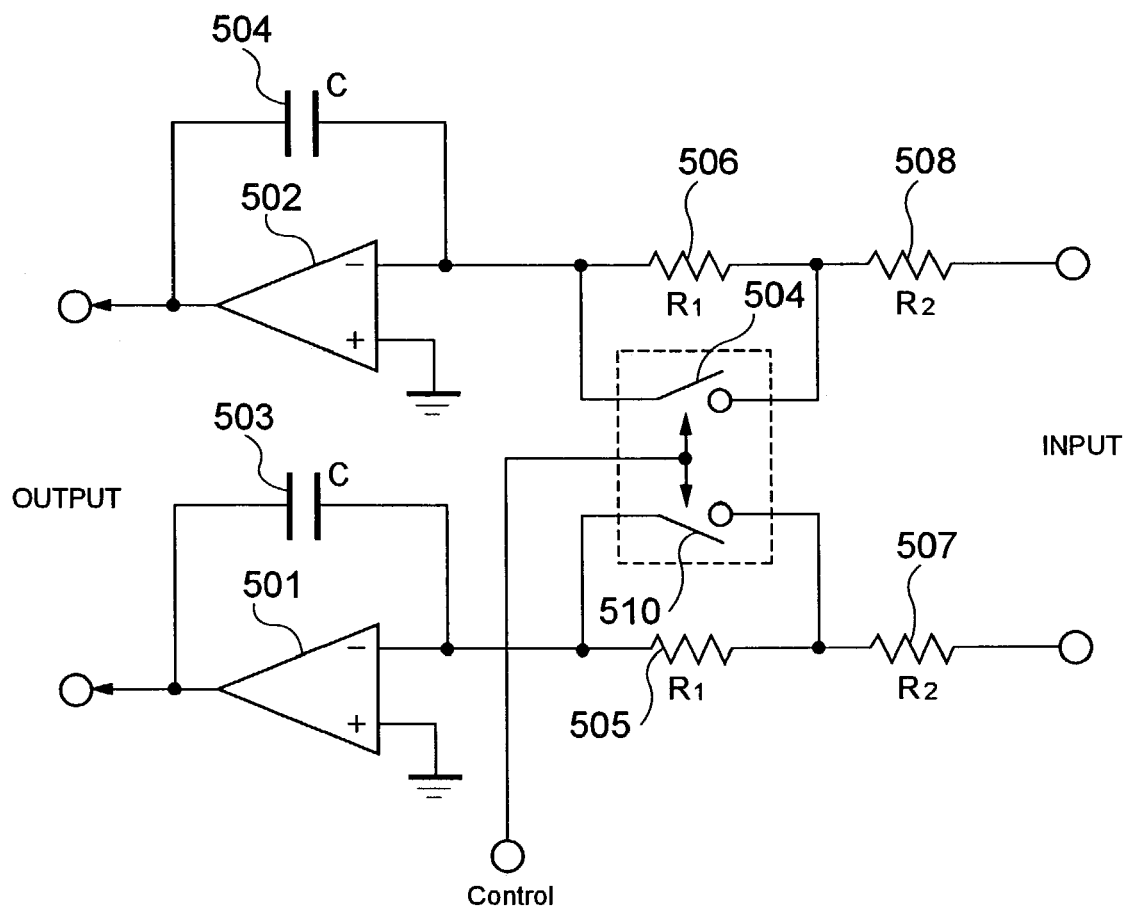
FIG. 3 is a block diagram showing one example of an integration constant variable inverter type integrator.

When the integration constant a of the integrator of FIG. 2 can be varied by an external signal (signal input through a Control terminal in FIG. 2), the low cut-off frequency can be varied as can be clear from the foregoing expression (4). The construction of the inverting integrator which can realize adjustment of the low cut-off frequency is illustrated in FIG. 3. FIG. 3 shows a balanced inverting integrator. The balanced inverting integrator shown in FIG. 3 is constructed with operational amplifiers 502 and 501, capacitors 504 and 503 and resistors 505 to 508. Switches 509 and 510 are controlled by an external Control terminal. When a signal of this Control terminal is "1", the switches 509 and 510 are turned ON, and when the signal of the Control terminal is "0", the switches 509 and 510 are turned OFF. By constructing such circuit, the integration constant α and the low cut-off frequency fc are expressed as follows depending upon the state of the Control terminal.

When Control=1:

$$\alpha=1/CR2$$

$$fc=\tfrac{1}{2}\pi CR2 \quad (5)$$

When Control=0

$$\alpha=1/C(R1+R2)$$

$$fc=\tfrac{1}{2}\pi C(R1+R2) \quad (6)$$

For example, selecting C=10 pF, R1=1.576 MΩ, R2=15.190 kΩ, it can be designed that when Control=1, fc becomes substantially 1 MHz and when Control=0, fc becomes substantially 10 kHz.

The Control terminal in FIG. 3 is the Control terminal in FIG. 2. This terminal is the control terminal of each high-pass filter in FIG. 1 and is connected to the output of the control circuit 102.

Figure 4:
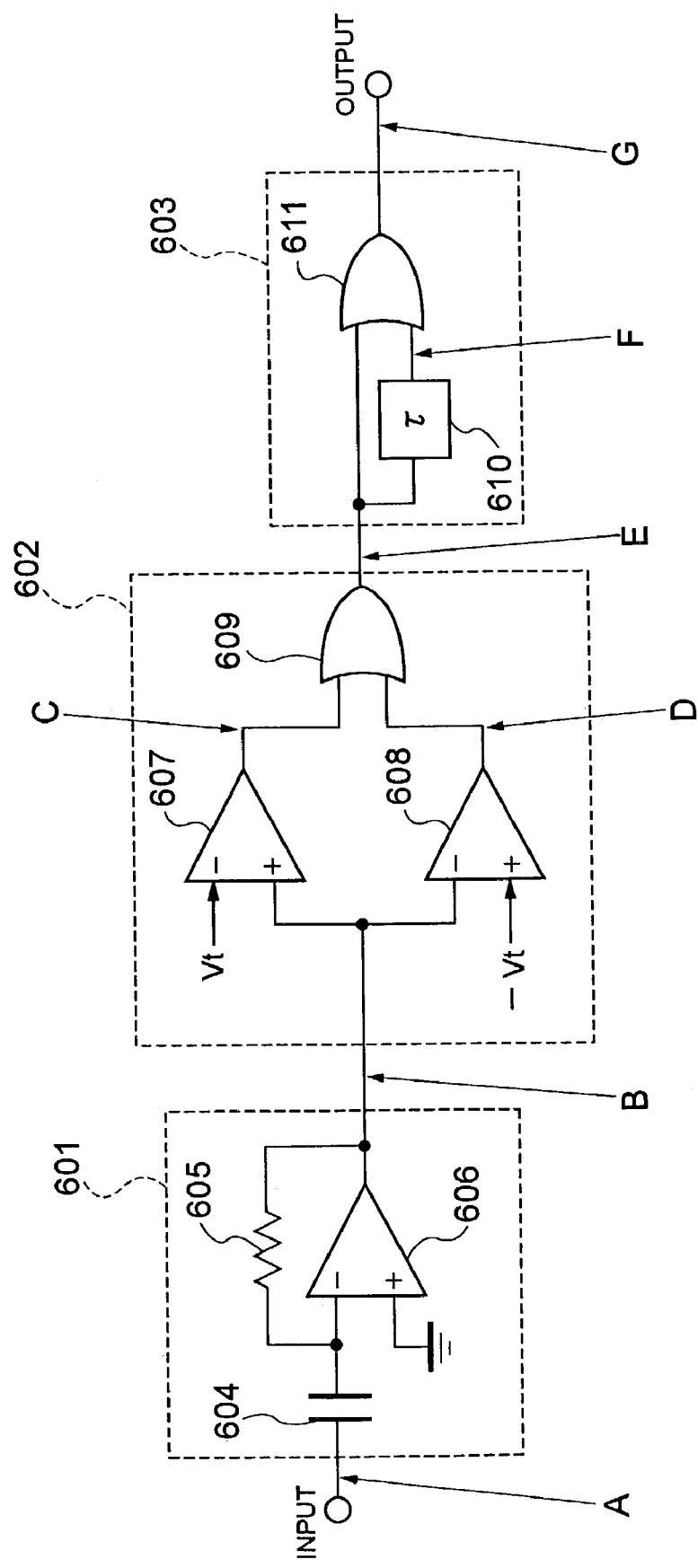
FIG. 4 is a block diagram showing an example of a low-frequency cut-off control circuit.

Next, discussion will be given for particular construction of the control circuit 102 and operation thereof. FIG. 4 shows one embodiment of the construction of the control circuit in the case when the gain control signal is an analog signal (it is desirable that the analog signal have linear relationship with dB value of the gain).

Figure 5:
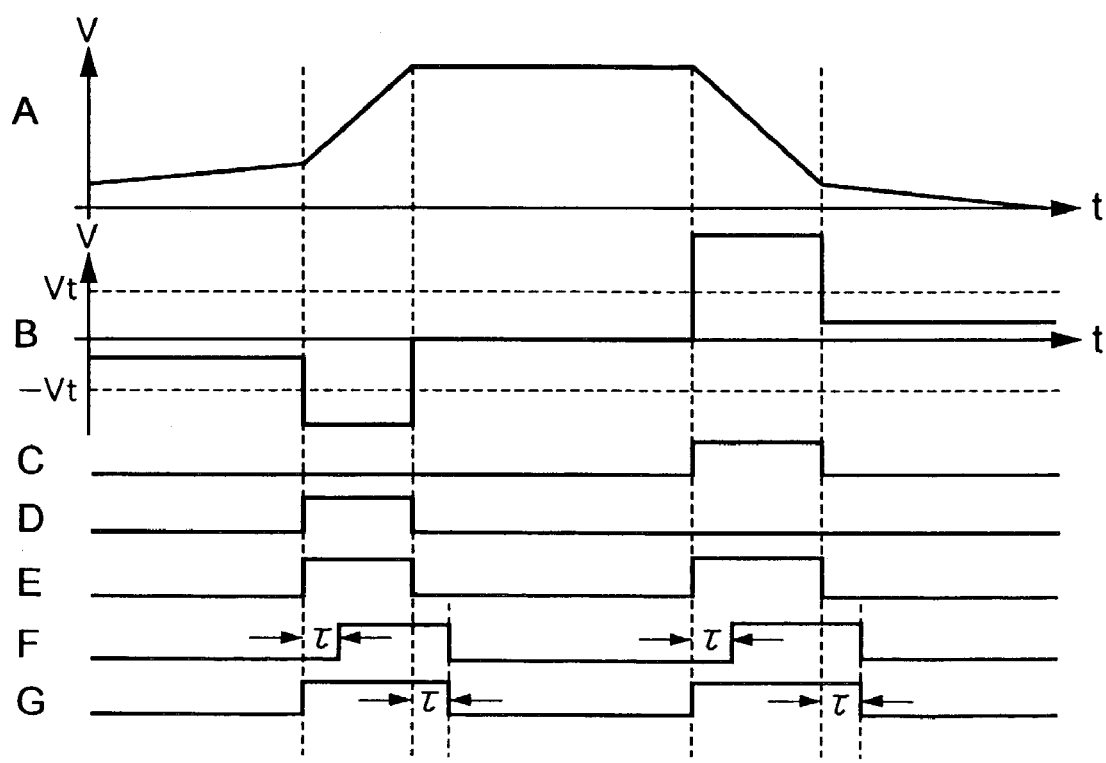
FIG. 5 is a timing chart showing an example for explaining operation of the low-frequency cut-off control circuit.

The input gain control signal A is converted into B proportional to variation magnitude of the signal by an inversion type differentiation circuit 601, at first. The differentiation circuit 601 can be easily constructed with an operational amplifier 606, a capacitor 604 and a resistor 605. In FIG. 5, a relationship between the input signal A and the output B of the differentiation circuit 601. The differentiated output B is input to a judgment circuit 602 to be compared with threshold voltages Vt and −Vt by comparators 607 and 608. A value of Vt is determined as a voltage variation value corresponding to a gain variation of 6 dB assuming that a criterion of the gain variation for switching the low cut-off frequency is 6 dB.

As shown in FIG. 5, when the differentiated output B exceeds Vt, a value C of the comparator 607 becomes "1", and conversely, only when the differentiated output B is less than or equal to −Vt, a value D of the comparator 608 becomes "1". In other instance, the values C and D are held "0". In the present invention, either positive and negative of variation of gain can be treated equally. Therefore, OR (logical sum) of C and D in an OR circuit 609 is taken as a value E. In a circuit 603, in a delay circuit 610, a delayed signal F is generated by delaying the signal E as input signal for a delay period τ. Then, a signal G as OR output of E and F is generated by an OR circuit 611. By this, during a given period (=τ) after switching of variation amount of gain from large to small, the control output G is maintained at "1". The value of τ is set for a period sufficient for converging transitional direct current offset by the high-pass filter.

As set forth above, it becomes possible to control the low cut-off frequency of the high-pass filter to be higher only during the period longer than the period where an absolute value of the variation of the input gain control signal is greater than the predetermined value |Vt|, in the extent of the given period "τ". Therefore, the task of the present invention set forth above can be achieved.

As alternative embodiment of the present invention, discussion will be given for a construction method of the control circuit 102 while the basic construction is the same as the former embodiment. The former embodiment has been discussed in terms of the case where the gain control signal is analog signal, whereas this alternative embodiment is the case where the gain control signal is a digital signal. For example, the gain control signal is provided from the external CPU in a form of data. In this case, the control circuit 102 is constructed as a kind of processor.

Figure 6:
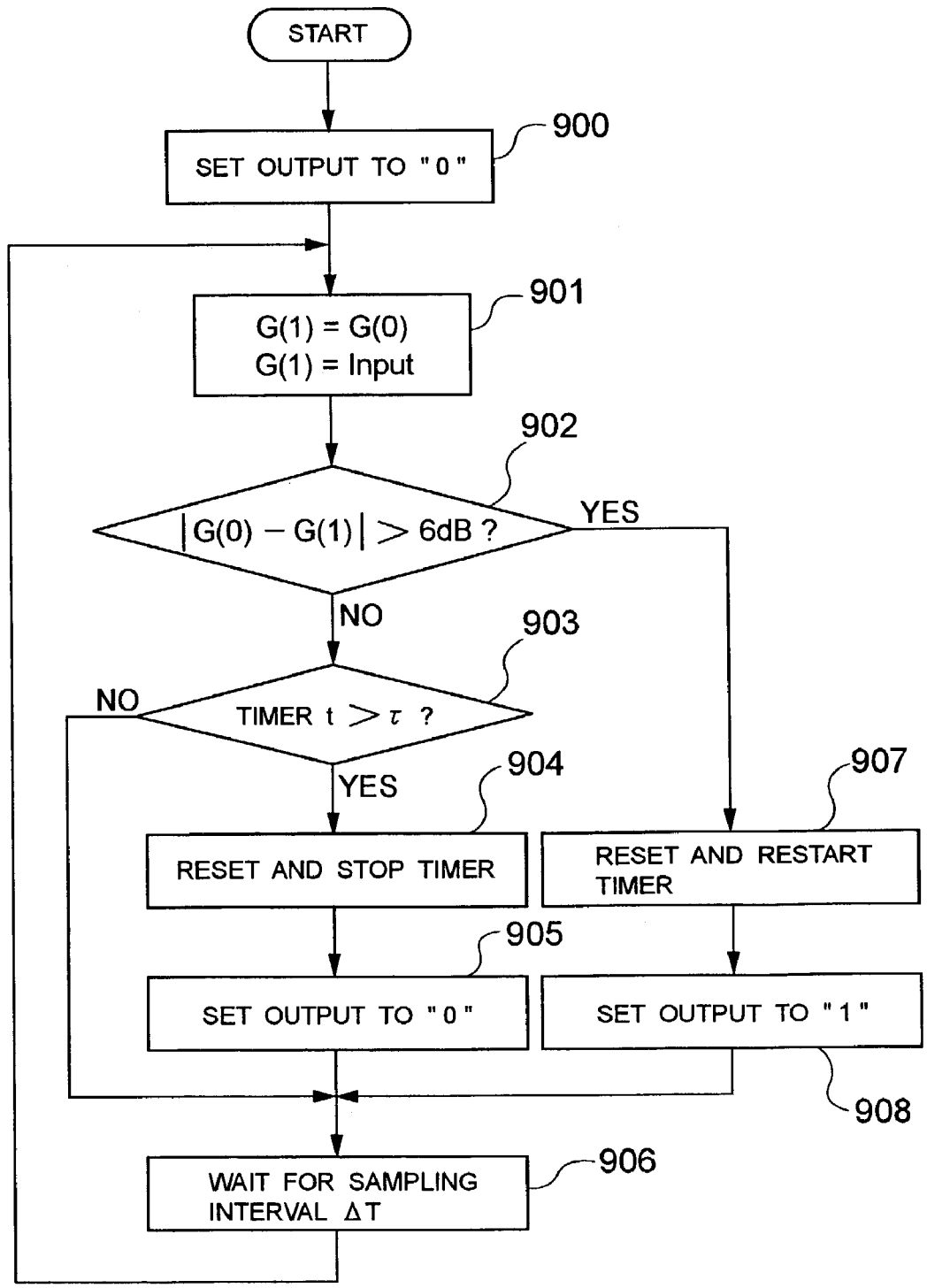
FIG. 6 is a flowchart of the case where the low-frequency cut-off control circuit is realized by a processor.
Figure 7:
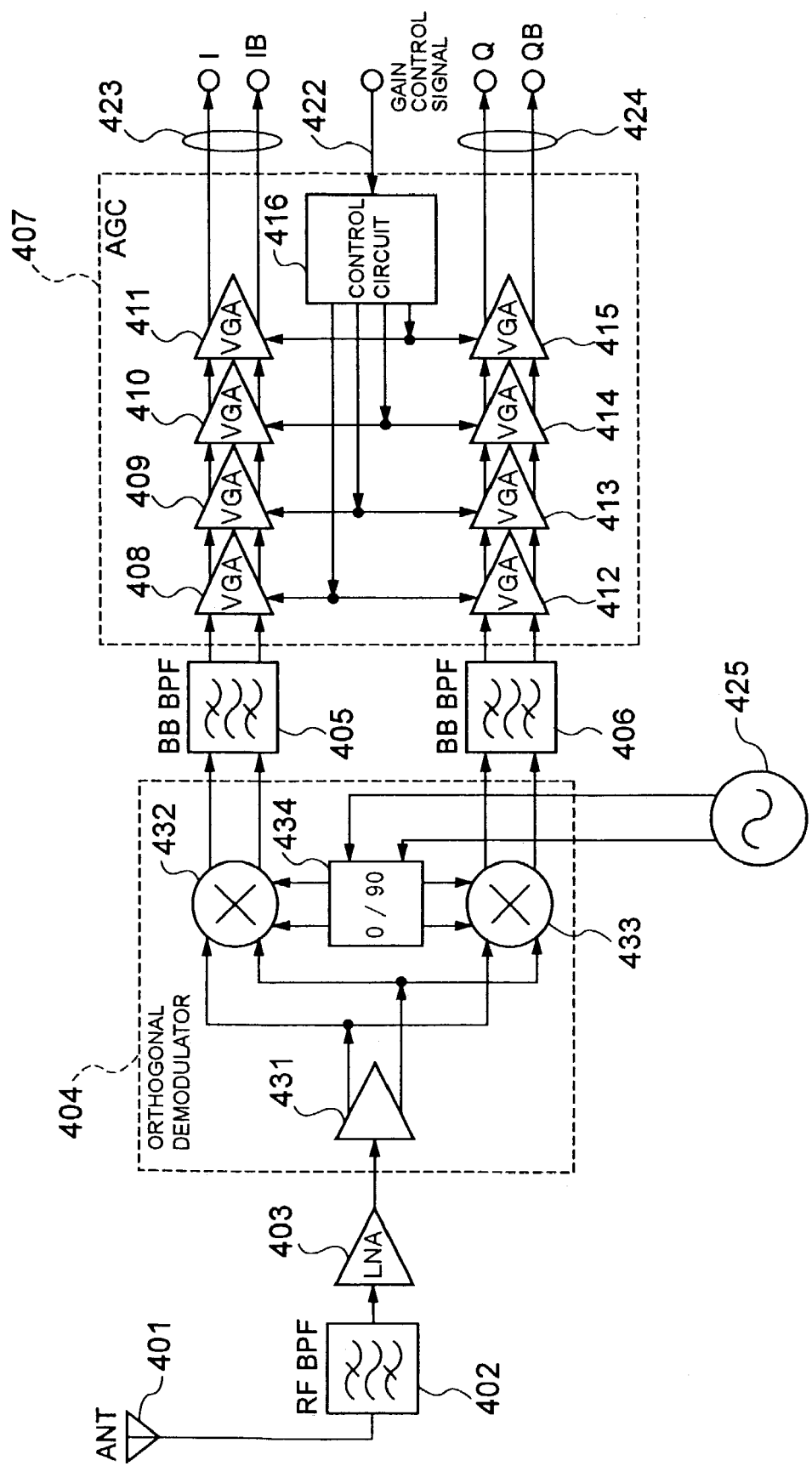
FIG. 7 is an illustration showing a construction of the conventional direct conversion type receiver.

FIG. 6 is a flowchart of the process in the case where the gain control signal is given in a form of digital data. At first, the control circuit (hereinafter referred to as "processor") starts operation from the initial state. At step 900, the control output "Output" is set to "0". Namely, in the initial condition, the low cut-off frequency is in low state.

Next, after storing a value of the past gain control signal G(0) at step 901, a new gain control signal "Input" is inputted to be stored in a register G(0). At judgment step 902, judgment is made whether an absolute value of the new and old gains is greater than a predetermined threshold value, for example 6 dB. If the absolute value is greater than the threshold value, the process jumps to step 907 and if the absolute value is smaller than the threshold value, the process is advanced to step 903. At step 907, a timer is restarted. Then, at step 908, the control output "Output" is set to "1". Thereafter, the process is advanced to step 906.

On the other hand, at step 903, check is performed whether a value of the timer exceeds τ or not. If τ is not exceeded, the process is simply advanced to step 906 without any process. If τ is exceeded, the timer is reset and stopped at step 904, and the control output "Output" is set to "0". Thereafter, process is advanced to step 906. At step 906, after waiting for a period ΔT corresponding to an input sampling interval of the processor, the process in returned to step 901. The process set forth above is repeated.

By realizing a processor operation shown in the shown embodiment in the control circuit, it becomes possible to realize the same operation as shown in the timing chart shown in FIG. 5. Thus, equivalent effect to the first embodiment can be realized.

On the other hand, in the shown embodiment, discussion has been given for the case where the gain control signal is the digital signal. However, the shown embodiment is also applicable even for the analog gain control signal by adding an A/D converter for analog-to-digital conversion. Such embodiment is also encompassed within the scope of the present invention.

As set forth above, with the present invention, it becomes possible to realize control in such a manner that when variation of the gain is sufficiently small, the low cut-off frequency can be set as low as possible, and conversely, when variation of the gain exceeds a predetermined value, the low cut-off frequency is set higher for quickly converging transitional direct current offset. As a result, by performing such control, the low cut-off frequency can be lowered when fluctuation of gain is small to feed the waveform to the demodulation circuit with high fidelity as much as possible to obtain stable receiving performance. On the other hand, when fluctuation of gain is large, large transitional direct current offset is caused. Therefore, in such case, the low cut-off frequency is set higher to quickly converge the direct current offset in transition to be less than or equal to 1% of the peak value to restore stable receiving condition.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A base band circuit of a receiver comprising:
   variable amplifier means for variably amplifying a base band signal depending upon a gain control signal;
   high-pass filter means provided in a path of said base band signal; and
   control means for detecting variation magnitude of said gain control signal and controlling variation of a low cut-off frequency of said high-pass filter means depending upon the detected variation magnitude,
   wherein said control means controls in such a manner that said low cut-off frequency is set at a first value when said variation magnitude is smaller than a predetermined value and said low cut-off frequency is set at a second value higher than said first value when said variation magnitude is greater than or equal to said predetermined value.

2. A base band circuit of a receiver as set forth in claim 1, wherein said gain control signal is an analog signal, said control means includes means for generating an absolute value of a signal corresponding to said variation magnitude by differentiating said analog signal in time and means for comparing said absolute value and a predetermined value for varying said low cut-off frequency depending upon a result of comparison.

3. A base band circuit of a receiver as set forth in claim 1, wherein said control means operates provide a predetermined delay period in control timing upon varying said low cut-off frequency from said second value to said first value.

4. A base band circuit of a receiver as set forth in claim 1, wherein said gain control signal is a digital signal, said control means includes means for sampling said digital signal at a predetermined interval and means for comparing an absolute value of variation magnitude of said digital signal within said sampling interval and a predetermined value for varying said low cut-off frequency depending upon a result of comparison.

5. A base band circuit of a receiver as set forth in claim 1, wherein said receiver is a direct conversion type receiver.

6. A base band circuit of a receiver as set forth in claim 1, wherein said low cut-off frequency is maintained for an unfixed duration at said first value while said variation magnitude is smaller than said predetermined value and said low cut-off frequency is maintained for an unfixed duration at said second value while said variation magnitude is greater than or equal to said predetermined value.

7. A low cut-off frequency control method in a base band circuit of a receiver including variable amplifier means for variably amplifying a base band signal depending upon a gain control signal and high-pass filter means provided in a path of said base band signal, comprising:

control step of detecting variation magnitude of said gain control signal and controlling variation of a low cut-off frequency of said high-pass filter means depending upon the detected variation magnitude, wherein said control means controls in such a manner that said low cut-off frequency is set at a first value when said variation magnitude is smaller than a predetermined value and said low cut-off frequency is set at a second value higher than said first value when said variation magnitude is greater than or equal to said predetermined value.

8. A low cut-off frequency control method as set forth in claim 7, wherein said gain control signal is an analog signal, said control step includes step of generating an absolute value of a signal corresponding to said variation magnitude by differentiating said analog signal in time and step of comparing said absolute value and a predetermined value for varying said low cut-off frequency depending upon a result of comparison.

9. A low cut-off frequency control method as set forth in claim 7, wherein said control step is executed for providing a predetermined delay period in control timing upon varying said low cut-off frequency from said second value to said first value.

10. A low cut-off frequency control method as set forth in claim 7, wherein said gain control signal is a digital signal, said control step includes step of sampling said digital signal at a predetermined interval and step of comparing an absolute value of variation magnitude of said digital signal within said sampling interval and a predetermined value for varying said low cut-off frequency depending upon a result of comparison.

11. A low cut-off frequency control method as set forth in claim 7, wherein said receiver is a direct conversion type receiver.

12. A low cut-off frequency control method as set forth in claim 7, wherein said low cut-off frequency is maintained for an unfixed duration at said first value while said variation magnitude is smaller than said predetermined value and said low cut-off frequency is maintained for an unfixed duration at said second value while said variation magnitude is greater than or equal to said predetermined value.

* * * * *